United States Patent
Zhu et al.

(10) Patent No.: US 9,929,211 B2
(45) Date of Patent: Mar. 27, 2018

(54) REDUCING SPIN PUMPING INDUCED DAMPING OF A FREE LAYER OF A MEMORY DEVICE

(75) Inventors: Xiaochun Zhu, San Diego, CA (US); Seung H. Kang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 973 days.

(21) Appl. No.: 12/236,956

(22) Filed: Sep. 24, 2008

(65) Prior Publication Data

US 2010/0074092 A1 Mar. 25, 2010

(51) Int. Cl.
*H01L 29/82* (2006.01)
*H01L 27/22* (2006.01)
*H01L 43/08* (2006.01)
*G11C 11/16* (2006.01)

(52) U.S. Cl.
CPC .......... *H01L 27/228* (2013.01); *G11C 11/161* (2013.01); *G11C 11/1673* (2013.01); *G11C 11/1675* (2013.01); *H01L 43/08* (2013.01)

(58) Field of Classification Search
CPC ..... H01L 43/08; H01L 29/82; H01L 23/5226; H01L 23/528; H01L 27/222; H01L 43/065; G11C 11/16
USPC ........................ 257/421–427, E29.323; 438/3
See application file for complete search history.

(56) References Cited

U.S. PATENT DOCUMENTS

| | | | |
|---|---|---|---|
| 6,590,806 B1 | 7/2003 | Bhattacharyya | |
| 7,005,691 B2 * | 2/2006 | Odagawa et al. | 257/295 |
| 7,088,609 B2 | 8/2006 | Valet | |
| 7,252,852 B1 * | 8/2007 | Parkin | 427/131 |
| 7,269,059 B2 * | 9/2007 | Morise et al. | 365/158 |
| 7,432,574 B2 * | 10/2008 | Nakamura et al. | 257/421 |
| 7,531,882 B2 * | 5/2009 | Nguyen et al. | 257/421 |
| 7,538,402 B2 * | 5/2009 | Fukumoto | 257/421 |
| 7,732,881 B2 * | 6/2010 | Wang | G11C 11/15 257/295 |

(Continued)

FOREIGN PATENT DOCUMENTS

| | | |
|---|---|---|
| CN | 1270696 A | 10/2000 |
| CN | 1308317 A | 8/2001 |

(Continued)

OTHER PUBLICATIONS

Sarma et al, Pro. Ind. Acad. Sci. vol. 113 Nos. 5 and 6, Oct.-Dec. 2001 pp. 515-525.*

(Continued)

*Primary Examiner* — Jami M Valentine

(74) *Attorney, Agent, or Firm* — W&T/Qualcomm

(57) ABSTRACT

A system and method of reducing spin pumping induced damping of a free layer of a memory device is disclosed. The memory device includes an anti-ferromagnetic material (AFM) pinning layer in contact with a bit line access electrode. The memory device also includes a pinned layer in contact with the AFM pinning layer, a tunnel barrier layer in contact with the pinned layer, and a free layer in contact with the tunnel barrier layer. The memory device includes a spin torque enhancing layer in contact with the free layer and in contact with an access transistor electrode. The spin torque enhancing layer is configured to substantially reduce spin pumping induced damping of the free layer.

20 Claims, 4 Drawing Sheets

(56) References Cited

U.S. PATENT DOCUMENTS

| | | | |
|---|---|---|---|
| 7,750,390 B2* | 7/2010 | Saito | G11C 11/16 257/314 |
| 7,750,421 B2* | 7/2010 | Horng | B82Y 25/00 257/421 |
| 2002/0051897 A1 | 5/2002 | Saito et al. | |
| 2003/0184918 A1* | 10/2003 | Lin et al. | 360/314 |
| 2004/0196598 A1* | 10/2004 | Zheng | B82Y 10/00 360/324.12 |
| 2005/0057960 A1* | 3/2005 | Saito | G11C 11/16 365/154 |
| 2005/0254287 A1 | 11/2005 | Valet | |
| 2006/0255383 A1* | 11/2006 | Kaiser | H01L 43/08 257/295 |
| 2007/0076471 A1 | 4/2007 | Kano et al. | |
| 2007/0195594 A1 | 8/2007 | Koga | |
| 2007/0201265 A1 | 8/2007 | Ranjan et al. | |
| 2007/0242502 A1* | 10/2007 | Hosomi | B82Y 25/00 365/158 |
| 2007/0253118 A1* | 11/2007 | Hayakawa | B82Y 25/00 360/324.2 |
| 2007/0297220 A1 | 12/2007 | Yoshikawa | |
| 2008/0061388 A1* | 3/2008 | Diao | G11C 11/16 257/421 |
| 2008/0094886 A1* | 4/2008 | Ranjan | B82Y 10/00 365/171 |
| 2008/0164547 A1 | 7/2008 | Higo et al. | |
| 2009/0080124 A1* | 3/2009 | Yoshikawa | B82Y 25/00 360/324.12 |
| 2009/0104718 A1* | 4/2009 | Zhong | B82Y 10/00 438/3 |
| 2009/0129141 A1* | 5/2009 | Hosotani | G11C 7/20 365/148 |
| 2009/0246557 A1* | 10/2009 | Horng | G01R 33/098 428/811.1 |
| 2009/0256220 A1* | 10/2009 | Horng | H01L 43/08 257/421 |
| 2010/0034014 A1* | 2/2010 | Ohno | G11C 11/16 365/158 |
| 2010/0065935 A1* | 3/2010 | Horng | B82Y 25/00 257/421 |
| 2010/0078742 A1* | 4/2010 | Zheng | G11C 11/16 257/421 |

FOREIGN PATENT DOCUMENTS

| | | |
|---|---|---|
| CN | 1961377 A | 5/2007 |
| CN | 101093721 A | 12/2007 |
| EP | 1227494 A2 | 7/2002 |
| JP | 2002204009 A | 7/2002 |
| JP | 2003060261 A | 2/2003 |
| JP | 2003297069 A | 10/2003 |
| JP | 2003318461 A | 11/2003 |
| JP | 2006165059 A | 6/2006 |
| JP | 2007157840 A | 6/2007 |
| JP | 2007537608 A | 12/2007 |
| JP | 2009239120 A | 10/2009 |
| KR | 20070004094 A | 1/2007 |
| KR | 20070035588 A | 3/2007 |
| KR | 20070121504 A | 12/2007 |
| WO | 2005112034 A2 | 11/2005 |

OTHER PUBLICATIONS

Ritchie et al, Phys. Rev. B 68, 104430 (2003) "Magnetic . . . NiMnSb".*

Karthik et al, APL 89, 05205 (2006) "Spin polarization . . . Heusler alloys".*

Yiming Huai et al., Spin Transfer Switching Current Reduction in Magnetic Tunnel Junction Based Dual Spin Filter Structures, 2005 American Institute of Physics, Applied Physics Letters 87, 222510 (2005), Published Nov. 23, 2005.

International Search Report—PCT/US2009/057467, International Search Authority—European Patent Office dated Aug. 12, 2009.

Written Opinion—PCT/US2009/057467, International Search Authority—European Patent Office dated Aug. 12, 2009.

Taiwan Search Report—TW098132348—TIPO—dated Jan. 23, 2013.

* cited by examiner

US 9,929,211 B2

REDUCING SPIN PUMPING INDUCED DAMPING OF A FREE LAYER OF A MEMORY DEVICE

I. FIELD

The present disclosure is generally related to reducing spin pumping induced damping of a free layer of a memory device.

II. DESCRIPTION OF RELATED ART

Magnetic tunneling junction (MTJ) elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When a current flows through the MTJ element, the magnetization direction of the free layer may be changed when the current exceeds a threshold value. The threshold value depends on various factors, including an effective damping factor of the free magnetic layer. The effective damping factor of the free magnetic layer may be a function of the thickness of the free magnetic layer and of the composition of the surrounding layers. The surrounding layers can modify the effective damping constant of the free magnetic layer via spin pumping effect. When spin pumping increases, the current threshold value also increases, resulting in increased power consumption and increased heat generation, both of which are generally undesirable.

III. SUMMARY

In a particular embodiment, a memory device is disclosed. The memory device includes a bit line access electrode and an anti-ferromagnetic material (AFM) pinning layer in contact with the bit line access electrode. The memory device also includes a pinned layer in contact with the AFM pinning layer, a tunnel barrier layer in contact with the pinned layer, and a free layer in contact with the tunnel barrier layer. The memory device further includes a spin torque enhancing layer in contact with the free layer and in contact with an access transistor electrode. The spin torque enhancing layer is configured to substantially reduce spin pumping induced damping of the free layer.

In another particular embodiment, a method of forming a memory device includes depositing a spin torque enhancing layer on a first electrical contact. The spin torque enhancing layer is one of an insulating layer, a tunnel barrier layer, and a semiconducting layer. The method also includes depositing a free layer on the spin torque enhancing layer. The method also includes depositing a spacer layer on the free layer. The method also includes depositing a pinned layer on the spacer layer. The method also includes depositing an anti-ferromagnetic material (AFM) pinning layer on the pinned layer. The method also includes depositing a second electrical contact on the AFM pinning layer. The spin torque enhancing layer is configured to substantially reduce a damping constant of the free layer.

In another particular embodiment, a magnetic tunneling junction (MTJ) structure includes an anti-ferromagnetic material (AFM) pinning layer in contact with an electrical contact. The MTJ structure also includes a pinned layer in contact with the AFM pinning layer. The MTJ structure also includes a tunnel barrier layer in contact with the pinned layer. The MTJ structure also includes a free layer in contact with the tunnel barrier layer. The MTJ structure also includes a spin torque enhancing layer in contact with the free layer. The spin torque enhancing layer includes magnesium oxide (MgO) and is configured to reduce a write current threshold by reducing a spin pumping effect. The free layer may be closer to a substrate than the pinned layer.

In another particular embodiment a method is disclosed that includes passing a read current through a first electrical contact of a memory device and through an anti-ferromagnetic material (AFM) pinning layer in contact with the first electrical contact. The method also includes detecting a resistance corresponding to a relative orientation of a magnetic moment of a free layer to a magnetic moment of a pinned layer in contact with the AFM pinning layer. The pinned layer is in contact with a tunnel barrier layer, the tunnel barrier layer is in contact with the free layer, the free layer is in contact with a spin torque enhancing layer, the spin torque enhancing layer is in contact with a second electrical contact of the memory device, and the second electrical contact is coupled to an access transistor.

One particular advantage provided by at least one of the disclosed embodiments is to substantially reduce asymmetrical switching, where a large write current can easily change a state of a magnetic tunneling junction (MTJ) device from an anti-parallel state to a parallel state, but a small write current has difficulty changing the state of the MTJ device from parallel to anti-parallel. Another particular advantage provided by at least one of the disclosed embodiments is to reduce the critical switching current for changing the state of the MTJ device. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
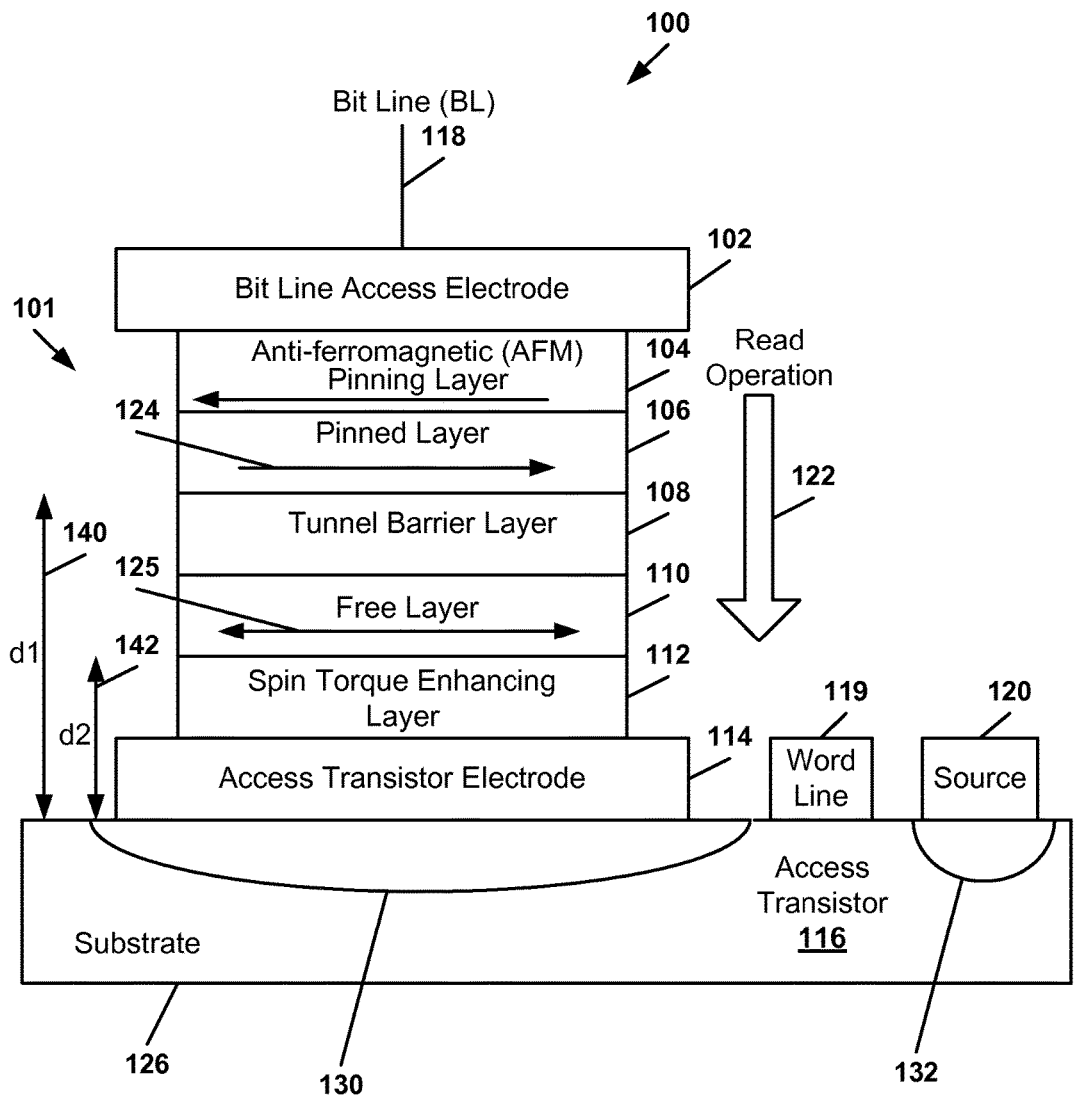
FIG. 1 is a first illustrative embodiment of an element of a spin-torque-transfer magnetic random access memory (STT-MRAM) device.

Referring to FIG. 1, a first illustrative embodiment of an element of a spin-torque-transfer magnetic random access memory (STT-MRAM) is depicted and generally designated 100. The element of the STT-MRAM 100 includes a bitcell having a magnetic tunneling junction (MTJ) structure 101 and an access transistor 116 on a substrate 126. The MTJ structure 101 includes a bit line access electrode 102 coupled to a bit line 118, an anti-ferromagnetic (AFM) pinning layer 104, a pinned layer 106, a tunnel barrier layer 108, a free layer 110, a spin torque enhancing layer 112, and an access transistor electrode 114. The access transistor electrode 114 is coupled to a drain region 130 of the access transistor 116. The access transistor 116 is gated by a word line 119 and has a source region 132 coupled to a source 120.

The AFM pinning layer 104 is in contact with the bit line access electrode 102. The AFM pinning layer 104 holds an orientation of a magnetic moment 124 of the pinned layer 106 in a particular direction. The pinned layer 106 is in contact with the AFM pinning layer 104 and may be composed of a ferromagnetic material.

The tunnel barrier layer 108 is in contact with the pinned layer 106 and physically isolates the pinned layer 106 from the free layer 110 while enabling current flow via electron tunneling across the tunnel barrier layer 108. The tunnel barrier layer 108 may be composed of a non-magnetic material. In an illustrative embodiment, the tunnel barrier layer 108 includes magnesium oxide (MgO).

The free layer 110 is in contact with the tunnel barrier layer 108 and is located at a distance d2 142 from the substrate 126. The free layer 110 has a magnetic moment 125 that may be in a parallel or antiparallel alignment with the magnetic moment 124 of the pinned layer 106. The pinned layer 106 may be at a distance d1 140 from the substrate 126 that is greater than the distance d2 142. The magnetic moment 125 of the free layer 110 may be written by a current exceeding a write current threshold and may be read using a current less than the write current threshold. In an illustrative embodiment, the free layer 110 may be ferromagnetic. In another illustrative embodiment, the free layer 110 may be a synthetic ferromagnetic layer.

The spin torque enhancing layer 112 is in contact with the free layer 110. The spin torque enhancing layer 112 is configured to substantially reduce spin pumping induced damping of the free layer 110, and thus reduces the write current threshold, as will be described in more detail below. In a particular embodiment, the spin torque enhancing layer 112 and the tunnel barrier layer 108 may include magnesium oxide (MgO), enabling the use of the same material for two layers and reducing the number of materials used during fabrication of the element of the STT-MRAM 100. Using magnesium oxide for the spin torque enhancing layer 112 and the tunnel barrier layer 108 may reduce a fabrication costs as fewer materials may be used and may also reduce a possibility of contamination. In an illustrative embodiment, the spin torque enhancing layer has a thickness of between 0.2 nanometers (nm) and 10 nm.

In a particular embodiment, the spin torque enhancing layer 112 includes at least one of an oxide of aluminum (Al), an oxide of boron (B), an oxide of copper (Cu), an oxide of cobalt (Co), an oxide of chromium (Cr), an oxide of iron (Fe), an oxide of germanium (Ge), an oxide of molybdenum (Mo), an oxide of magnesium (Mg), an oxide of niobium (Nb), an oxide of nickel (Ni), an oxide of silicon (Si), an oxide of tantalum (Ta), an oxide of titanium (Ti), an oxide of vanadium (V), and an oxide of tungsten (W).

In another particular embodiment, the spin torque enhancing layer 112 includes at least one of a nitride of aluminum (Al), a nitride of boron (B), a nitride of silicon (Si), a nitride of germanium (Ge), a nitride of titanium (Ti), and a nitride of platinum (Pt).

In another particular embodiment, the spin torque enhancing layer 112 includes at least one of an oxide of silver (Ag), an oxide of aluminum (Al), an oxide of arsenic (As), an oxide of gold (Au), an oxide of carbon (C), an oxide of cadmium (Cd), an oxide of copper (Cu), an oxide of gallium (Ga), an oxide of germanium (Ge), an oxide of mercury (Hg), an oxide of indium (In), an oxide of iridium (Ir), an oxide of osmium (Os), an oxide of palladium (Pd), an oxide of platinum (Pt), an oxide of antimony (Sb), an oxide of silicon (Si), and an oxide of tellurium (Te).

In another particular embodiment, the spin torque enhancing layer 112 comprises a half-metallic material such as double perovskite ($SR_2FeMoO_6$), perovskite oxide alloy ($La_{0.7}Sr_{0.3}$)$MnO_3$, half-Heusler alloy (NiMnSb), magnetite ($Fe_3O_4$), or chromium dioxide ($CrO_2$). In another embodiment, the spin torque enhancing layer 112 is one of an insulating layer, a tunnel barrier layer, or a semiconducting layer.

The spin torque enhancing layer 112 is configured to substantially reduce spin pumping induced damping of the free layer 110 to reduce a critical current density for a write operation, which determines the write current threshold. In a particular embodiment, the spin torque enhancing layer 112 includes Magnesium Oxide (MgO). When a spin-polarized current passes through the MTJ structure 101, a portion of the spin momentum of the electrons of the spin-polarized current may be transferred to the free layer 110. The magnetic moment of the free layer 110 may change direction when the current density is greater than a particular critical current density. The current at which spin transfer induced switching can occur in the free layer 110 is indicated by the write current threshold. When the write current threshold is high, large devices, such as the access transistor 116, are required to drive the write current, which may result in reduced bitcell density, additional heat, increased power consumption and other issues.

Generally, the write current threshold decreases when an effective damping of the free layer 110 decreases. The effective damping of the free layer 110 includes a damping component representing a loss of angular momentum from the magnetization of the free layer 110 due to exchange coupling with free electrons able to leave the free layer 110. This "spin pumping" effect results in a greater amount of current needed to change a direction of the magnetic moment 125 of the free layer 110. By reducing the spin pumping effect, the spin torque enhancing layer 112 reduces the critical current density and the write current threshold of the MTJ structure 101, enabling a corresponding decrease in a size of the access transistor 116 and an increase in bitcell density.

The direction in which a write current is passed through the MTJ structure 101 determines whether the magnetic moment 124 of the pinned layer 106 is aligned to be parallel or anti-parallel to the magnetic moment 125 of the free layer 110. In an illustrative embodiment, a data "1" value may be stored by passing a first write current from the bit line access electrode 102 to the access transistor electrode 114 to align the magnetic moment 125 anti-parallel to the magnetic moment 124. A data "0" value may be stored by passing a second write current from the access transistor electrode 114 to the bit line access electrode 102 to align the magnetic moment 125 parallel to the magnetic moment 124.

When a read operation 122 is performed on the element of the STT-MRAM 100, a read current may flow from the bit line access electrode 102 to the source 120 or the read current may flow from the source 120 to the bit line access electrode 102. In a particular embodiment, a direction of the read current may be determined based on which direction provides the largest read signal. In a particular embodiment, when the read operation 122 is performed on the element of the STT-MRAM 100, a read current flows through via the bit line (BL) 118, in a direction from the bitline access electrode 102 to the access transistor electrode 114. The read current through the MTJ structure 101 encounters a resistance corresponding to a relative orientation of the magnetic moment 125 and the magnetic moment 124. When the magnetic moment 124 of the pinned layer 106 has a parallel orientation to the magnetic moment 125 of the free layer 110, the read current encounters a resistance different than when the magnetic moment 124 of the pinned layer 106 has an anti-parallel orientation to the magnetic moment 125 of the free layer 110.

The bitcell may therefore be used as an element of a memory device, such as an STT-MRAM. By employing the spin torque enhancing layer 112, a damping factor of the spin-pumping induced damping of the free layer 110 is substantially reduced, reducing the critical current, resulting in less power consumption and less heat generation than an equivalent magnetic tunneling junction (MTJ) device without a spin torque enhancing layer.

Further, because the free layer 110 is deposited on the spin torque enhancing layer 112 earlier in the fabrication process than the pinned layer 106, the free layer 110 is smoother and enables better control of the magnetic properties of the pinned layer 106 than in a configuration where the pinned layer is deposited earlier and the free layer is deposited later. By depositing the free layer 110 closer to the substrate 126 on the spin torque enhancing layer 112, the asymmetrical switching observed in conventional MTJ devices is also reduced.

Figure 2:
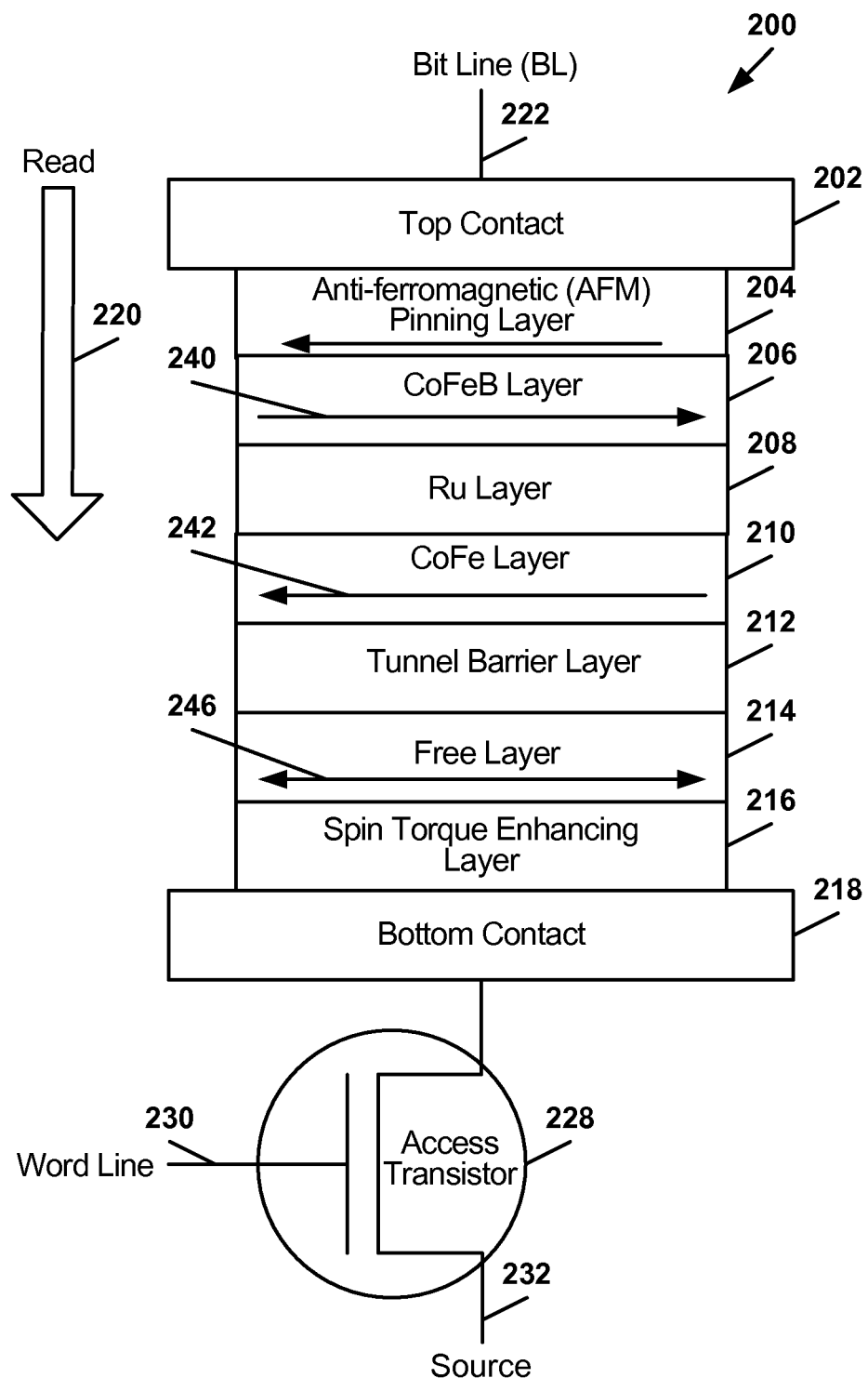
FIG. 2 is a second illustrative embodiment of an element of an STT-MRAM device.

Referring to FIG. 2, a second illustrative embodiment of an element of a spin-torque-transfer magnetic random access memory (STT-MRAM) is depicted and generally designated 200. The element of the STT-MRAM 200 includes a top contact 202, an anti-ferromagnetic (AFM) pinning layer 204, a Cobalt-Iron-Boron (CoFeB) layer 206, a Ruthenium (Ru) layer 208, a Cobalt-Iron (CoFe) layer 210, a tunnel barrier layer 212, a free layer 214, a spin torque enhancing layer 216, and a bottom contact 218. An access transistor 228 is coupled to the bottom contact 218 and coupled to a word line 230 and a source 232. In a particular embodiment, the element of the STT-MRAM 200 is the element of the STT-MRAM 100 of FIG. 1.

The top contact 202 provides a first electrical contact to a bit line 222. The AFM pinning layer 204 fixes an orientation of a magnetic moment 240 of the CoFeB layer 206 and the CoFe layer 210. The CoFeB layer 206 is a first pinned layer and may include a compound consisting essentially of Cobalt (Co), Iron (Fe) and Boron (B). The Ru layer 208 is a second pinned layer that consists essentially of Ruthenium. The CoFe layer 210 is a third pinned layer and consists essentially of Cobalt (Co) and Iron (Fe). The CoFeB layer 206, the Ru layer 208, and the CoFe layer 210 collectively form a synthetic pinned layer.

The tunnel barrier layer 212 may be a non-conductive, non-magnetic material configured to enable electron tunneling between the CoFe layer 210 and the free layer 214. The free layer 214 is a storage layer having a magnetic moment 244 with a programmable orientation that can be set in a parallel or anti-parallel alignment with the magnetic moment 242 of the CoFe layer 210. The spin torque enhancing layer 216 is configured to substantially reduce spin pumping induced damping of the free layer 214. The spin torque enhancing layer 216 may include Magnesium Oxide (MgO). The bottom contact 218 provides a second electrical contact to the access transistor 228.

When data is written to the element of the STT-MRAM 200, a write current flows through the access transistor 228. When the write current flows in a particular direction, the free layer 214 has a first state, where the magnetic moment 244 is parallel to the magnetic moment 242 of the CoFe layer 210. When the write current flows in the opposite direction, the free layer 214 has a second state, where the magnetic moment 244 is anti-parallel to the magnetic moment 242 of the CoFe layer 210.

When a read operation 220 is performed on the element of the STT-MRAM 200, a read current may flow through from the top contact 202 to the bottom contact 218 or the read current may flow from the bottom contact 218 to the top contact 202. In a particular embodiment, a direction of the read current may be determined based on which direction provides the largest read signal. In a particular embodiment, when the read operation 220 is performed on the element of the STT-MRAM 200, a read current flows through via a bit line (BL) 222, through the top contact 202, through the AFM pinning layer 204, through the CoFeB layer 206, and the Ru layer 208 to detect a resistance corresponding to relative orientation of magnetic moments of the free layer 214 and the CoFe layer 210. The detected resistance indicates a logical value stored at the element of the STT-MRAM 200.

Logical values may be written to the element of the STT-MRAM 200 by applying a write current that exceeds a write current threshold to set a direction of the magnetic moment 244 of the free layer 214 relative to the magnetic moment 242 of the CoFe layer 210. The spin torque enhancing layer 216 reduces a loss of angular momentum at the free layer 214 due to spin pumping and as a result lowers the critical current density to set the direction of the magnetic moment 244 of the free layer 214, in embodiments where the free layer is below the pinned layer, such as illustrated in FIG. 2, as well as in embodiments where the free layer is above the pinned layer and the spin torque enhancement layer is above the free layer. In addition, because the free layer 214 is below the pinned layer 206-210 in the embodiment depicted in FIG. 2, the free layer 214 may have better controlled parameters, resulting in a reduced write current asymmetry of the element of the STT-MRAM 200 as compared to structures having a reverse layer order.

Figure 3:
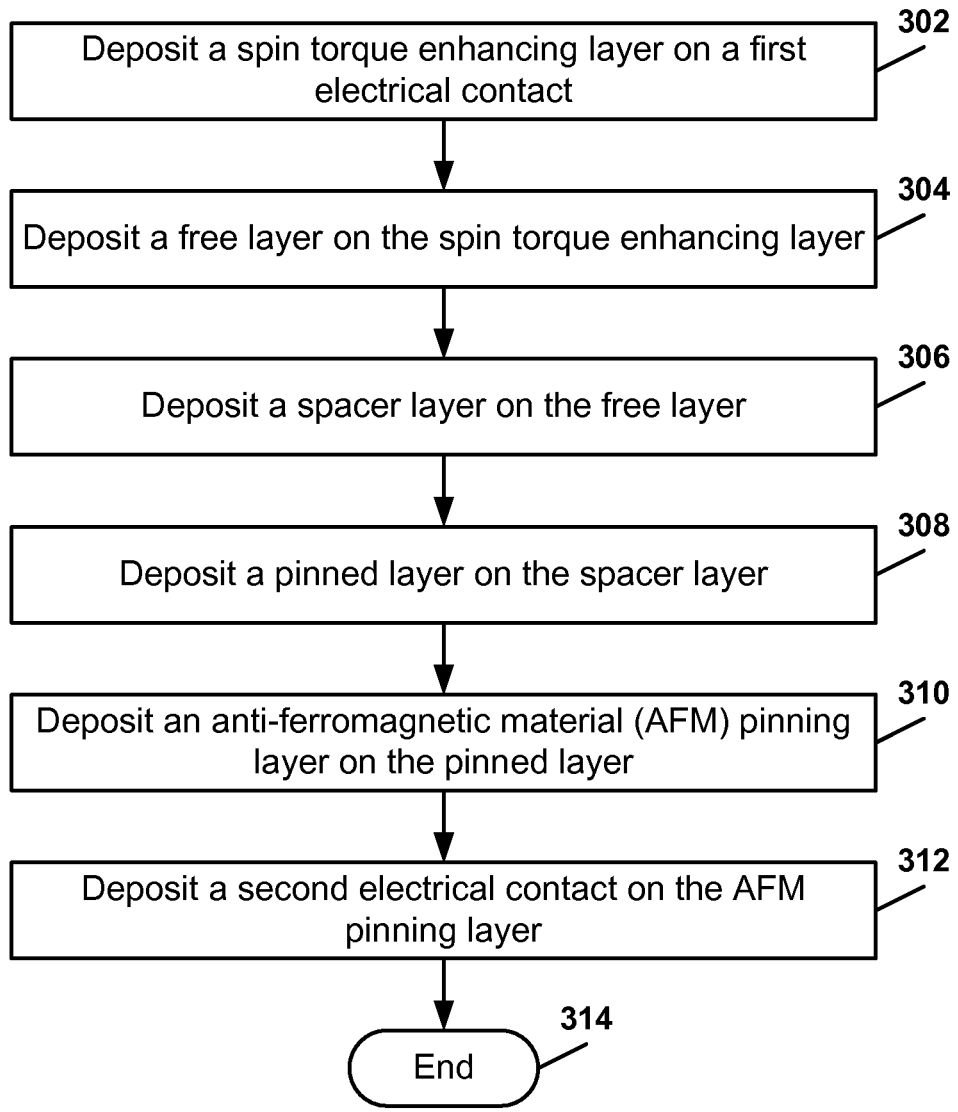
FIG. 3 is a flow diagram of an illustrative embodiment of a method of forming an element of an STT-MRAM device.

FIG. 3 is a flow diagram of an illustrative embodiment of a method of fabricating a memory device. At 302, a spin torque enhancing layer is deposited on a first electrical contact. The spin torque enhancing layer is one of an insulating layer, a tunnel barrier layer, and a semiconducting layer. In a first illustrative embodiment, the spin torque enhancing layer may include a half-metallic material. The half-metallic material may include at least one of double perovskite ($SR_2FeMoO_6$), perovskite oxide alloy ($La_{0.7}Sr_{0.3}$)$MnO_3$, half-Heusler alloy (NiMnSb), magnetite ($Fe_3O_4$), and chromium dioxide ($CrO_2$). In a second illustrative embodiment, the spin torque enhancing layer may include magnesium oxide (MgO).

Continuing to 304, a free layer is deposited on the spin torque enhancing layer. In an illustrative embodiment, the free layer may include a synthetic ferromagnetic material. The spin torque enhancing layer is configured to substantially reduce a damping constant of the free layer. The free layer is deposited closer to the substrate to enable improved control over process parameters of the free layer. In a particular embodiment, the spin torque enhancing layer and the closer proximity of the free layer to the substrate enables improved write characteristics by lowering a critical current and reducing a write asymmetry.

Advancing to 306, a spacer layer is deposited on the free layer. The spacer layer may be a non-magnetic layer. In a particular embodiment, the spacer layer is a tunnel barrier layer of a thin non-conductive material. Moving to 308, a pinned layer is deposited on the spacer layer. Proceeding to 310, an anti-ferromagnetic material (AFM) pinning layer is deposited on the pinned layer. Continuing to 312, a second electrical contact is deposited on the AFM pinning layer. The method ends at 314.

Figure 4:
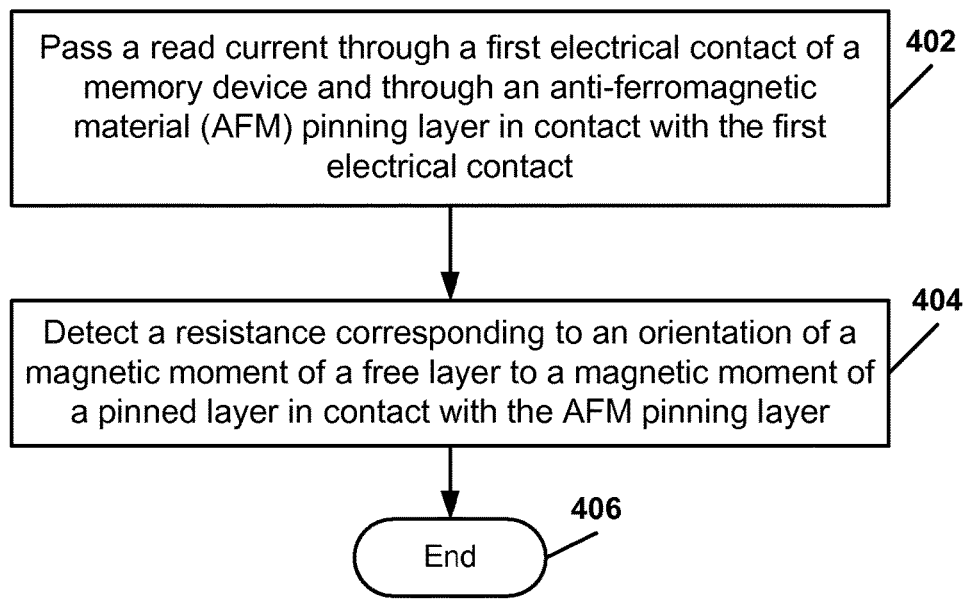
FIG. 4 is a flow diagram of an illustrative embodiment of a method of reading an element of an STT-MRAM device.

FIG. 4 is a flow diagram of an illustrative embodiment of a method of reading an element of an STT-MRAM. At 402, a read current is passed through a first electrical contact of a memory device and through an anti-ferromagnetic material (AFM) pinning layer in contact with the first electrical contact. Continuing to 404, a resistance corresponding to an orientation of a magnetic moment of a free layer to a magnetic moment of a pinned layer in contact with the AFM pinning layer is detected. The pinned layer is in contact with a tunnel barrier layer that is also in contact with the free layer. The free layer is in contact with a spin torque enhancing layer, and the spin torque enhancing layer is in contact with a second electrical contact of the memory device. The second electrical contact is coupled to an access transistor. The spin torque enhancing layer may include magnesium oxide (MgO). The spin torque enhancing layer may be configured to substantially reduce spin pumping induced damping of the free layer. The method ends at 406.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
   a bit line access electrode in contact with a bit line;
   an anti-ferromagnetic material (AFM) pinning layer in contact with the bit line access electrode;
   a pinned layer in contact with the AFM pinning layer;
   a tunnel barrier layer in contact with the pinned layer;
   a free layer in contact with the tunnel barrier layer;
   a spin torque enhancing layer in contact with the free layer, wherein the spin torque enhancing layer comprises magnesium oxide (MgO) and wherein the spin torque enhancing layer further comprises at least one of silver oxide (AgO), arsenic oxide (AsO), cadmium oxide (CdO), gallium oxide (GaO), mercury oxide (HgO), indium oxide (InO), iridium oxide (IrO), osmium oxide (OsO), palladium oxide (PdO), antimony oxide (SbO), and tellurium oxide (TeO); and
   an access transistor electrode in contact with the spin torque enhancing layer and in contact with a substrate.

2. The memory device of claim 1, wherein the spin torque enhancing layer has a thickness greater than 5 nanometers (nm) and less than or equal to 10 nm, and wherein the free layer is deposited on the spin torque enhancing layer earlier in a fabrication process than depositing of the pinned layer.

3. The memory device of claim 1, wherein a data value is read in response to a read current applied between the bit line access electrode and the access transistor electrode.

4. The memory device of claim 3, wherein the read current flows through the bit line access electrode and the AFM pinning layer to detect a resistance corresponding to an orientation of magnetic moments of the free layer and the pinned layer.

5. The memory device of claim 1, wherein the memory device is an element of a spin torque tunneling magnetic tunneling junction (STT-MTJ) device.

6. The memory device of claim 1, wherein the pinned layer comprises a first pinned layer and a second pinned layer between the first pinned layer and a third pinned layer, and wherein the first pinned layer consists essentially of Cobalt (Co), Iron (Fe), and Boron (B).

7. The memory device of claim 6, wherein the second pinned layer consists essentially of Ruthenium (Ru), and wherein the second pinned layer is in contact with the first pinned layer.

8. The memory device of claim 7, wherein the third pinned layer consists essentially of Cobalt (Co) and Iron (FE) and is in contact with the second pinned layer.

9. The memory device of claim 1, wherein the tunnel barrier layer comprises Magnesium Oxide (MgO).

10. A method of forming a memory device, the method comprising:
    depositing a spin torque enhancing layer on an access transistor electrode that is in contact with a substrate, wherein the spin torque enhancing layer comprises magnesium oxide (MgO) and wherein the spin torque enhancing layer further comprises at least one of silver oxide (AgO), arsenic oxide (AsO), cadmium oxide (CdO), gallium oxide (GaO), mercury oxide (HgO), indium oxide (InO), iridium oxide (IrO), osmium oxide (OsO), palladium oxide (PdO), antimony oxide (SbO), and tellurium oxide (TeO);
    after depositing the spin torque enhancing layer, depositing a free layer on the spin torque enhancing layer;

after depositing the free layer, depositing a spacer layer on the free layer;

after depositing the spacer layer, depositing a pinned layer on the spacer layer;

after depositing the pinned layer, depositing an anti-ferromagnetic material (AFM) pinning layer on the pinned layer; and after depositing the AFM pinning layer, depositing a bit line access electrode that is in contact with a bit line.

11. The method of claim 10, wherein the spin torque enhancing layer further comprises a half-metallic material and has a thickness greater than 7 nanometers (nm) and less than or equal to 10 nm.

12. The method of claim 10, wherein the free layer comprises a synthetic ferromagnetic material, and wherein the free layer is deposited on the spin torque enhancing layer earlier in a fabrication process than depositing the pinned layer.

13. The method of claim 10, wherein the spacer layer comprises a tunnel barrier layer.

14. A magnetic tunneling junction (MTJ) structure comprising:
a bit line access electrode in contact with a bit line;
an anti-ferromagnetic material (AFM) pinning layer in contact with the bit line access electrode;
a pinned layer in contact with the AFM pinning layer;
at least one layer comprising a tunnel barrier layer in contact with the pinned layer;
a free layer in contact with the at least one layer comprising the tunnel barrier layer;
a spin torque enhancing layer in contact with the free layer, wherein the spin torque enhancing layer comprises magnesium oxide (MgO) and wherein the spin torque enhancing layer further comprises at least one of silver oxide (AgO), arsenic oxide (AsO), cadmium oxide (CdO), gallium oxide (GaO), mercury oxide (HgO), indium oxide (InO), iridium oxide (IrO), osmium oxide (OsO), palladium oxide (PdO), antimony oxide (SbO), and tellurium oxide (TeO); and
an access transistor electrode that is in contact with the spin torque enhancing layer and in contact with a substrate.

15. The memory device of claim 1, wherein the spin torque enhancing layer further comprises an oxide of copper (Cu).

16. The MTJ structure of claim 14, wherein the spin torque enhancing layer has a thickness greater than 7 nanometers (nm) and less than or equal to 10 nm, and wherein the free layer is deposited on the spin torque enhancing layer earlier in a fabrication process than depositing of the pinned layer.

17. An apparatus comprising:
means for passing a read current through a bit line access electrode of a memory device and through an anti-ferromagnetic material (AFM) pinning layer, wherein the bit line access electrode is in contact with a bit line; and means for detecting a resistance corresponding to a relative orientation of a first magnetic moment of a free layer that is in contact with a spin torque enhancing layer to a second magnetic moment of a pinned layer, the spin torque enhancing layer comprising magnesium oxide (MgO), the pinned layer in contact with the AFM pinning layer and in contact with a tunnel barrier layer, wherein the tunnel barrier layer is in contact with the free layer, wherein the free layer is in contact with the spin torque enhancing layer, and wherein the spin torque enhancing layer is in contact with an access transistor electrode that is in contact with a substrate.

18. A non-transitory computer-readable medium storing instructions comprising:
instructions that, when executed by a processor, cause the processor to:
pass a read current through a bit line access electrode of a memory device and through an anti-ferromagnetic material (AFM) pinning layer, wherein the bit line access electrode is in contact with a bit line; and
detect a resistance corresponding to a relative orientation of a first magnetic moment of a free layer that is in contact with a spin torque enhancing layer to a second magnetic moment of a pinned layer, the pinned layer in contact with the AFM pinning layer, wherein the pinned layer is in contact with a tunnel barrier layer, wherein the tunnel barrier layer is in contact with the free layer, wherein the free layer is in contact with the spin torque enhancing layer, wherein the spin torque enhancing layer comprises magnesium oxide (MgO), and wherein the spin torque enhancing layer is in contact with an access transistor electrode in contact with a substrate.

19. A memory device comprising:
a bit line access electrode in contact with a bit line;
an anti-ferromagnetic material (AFM) pinning layer in contact with the bit line access electrode;
a pinned layer in contact with the AFM pinning layer;
a magnesium oxide (MgO) tunnel barrier layer in contact with the pinned layer;
a free layer in contact with the MgO tunnel barrier layer; and
a magnesium oxide (MgO) spin torque enhancing layer in contact with the free layer, wherein the MgO spin torque enhancing layer has a thickness greater than 7 nanometers (nm) and less than or equal to 10 nm and wherein the free layer is deposited on the MgO spin torque enhancing layer earlier in a fabrication process than depositing of the pinned layer; and
an access transistor electrode in contact with the MgO spin torque enhancing layer and in contact with a substrate.

20. The memory device of claim 1, wherein the free layer enables control of magnetic properties of the pinned layer and reduces asymmetrical switching in a magnetic tunneling junction (MTJ) device.

* * * * *